United States Patent
Schlag et al.

(10) Patent No.: US 9,476,946 B2
(45) Date of Patent: Oct. 25, 2016

(54) SOC DETERMINATION BY EVALUATION OF EFFECTS INVOKED BY DIMENSIONAL CHANGES OF BATTERY CELLS

(71) Applicant: GM GLOBAL TECHNOLOGY OPERATIONS LLC, Detroit, MI (US)

(72) Inventors: Harald Schlag, Rüesselsheim (DE); Christoph Klunker, Frankfurt (DE); Matthias Hampel, Rüesselsheim (DE)

(73) Assignee: GM Global Technology Operations LLC, Detroit, MI (US)

( * ) Notice: Subject to any disclaimer, the term of this patent is extended or adjusted under 35 U.S.C. 154(b) by 641 days.

(21) Appl. No.: 13/889,894

(22) Filed: May 8, 2013

(65) Prior Publication Data
US 2014/0333312 A1    Nov. 13, 2014

(51) Int. Cl.
H02J 7/00 (2006.01)
G01R 31/36 (2006.01)
H01M 10/48 (2006.01)
H01M 10/0525 (2010.01)

(52) U.S. Cl.
CPC .......... G01R 31/3606 (2013.01); H01M 10/48 (2013.01); H01M 10/0525 (2013.01); Y02T 10/7011 (2013.01)

(58) Field of Classification Search
CPC .................................................. G01R 31/3606
USPC ............... 320/107, 112, 127, 128, 132, 137; 702/63
See application file for complete search history.

(56) References Cited

U.S. PATENT DOCUMENTS

| | | | |
|---|---|---|---|
| 2011/0177377 A1 | 7/2011 | Dube | |
| 2013/0029185 A1* | 1/2013 | Ridley | H01M 10/48 429/51 |
| 2014/0255738 A1* | 9/2014 | Adams | H01M 10/48 429/90 |

* cited by examiner

*Primary Examiner* — Richard V Muralidar
(74) *Attorney, Agent, or Firm* — John A. Miller; Miller IP Group, PLC

(57) ABSTRACT

A system and method for monitoring a state-of-charge (SOC) of a battery, where the system includes a sensor and a controller. The sensor provides a measurement signal that can track changes of a nominal volume of the battery by either measuring a size or pressure of the battery, where the nominal volume is the volume that the electrolyte, anode, cathode and current collectors would occupy if unconstrained. The controller is programmed to use a function to estimate the SOC from the measurement signal. The function can be established after constructing and finding a repeatable charging and discharging curve of the battery that graphs the measurement signal compared to the SOC of the battery.

10 Claims, 4 Drawing Sheets

SOC DETERMINATION BY EVALUATION OF EFFECTS INVOKED BY DIMENSIONAL CHANGES OF BATTERY CELLS

BACKGROUND OF THE INVENTION

1. Field of the Invention

This invention relates generally to a system and method for estimating a state-of-charge (SOC) of a battery, and, more particularly, to a system and method for estimating the SOC of a battery using changes in the size or pressure of the battery.

2. Discussion of the Related Art

Electric vehicles are becoming more and more prevalent. These vehicles include hybrid vehicles, such as extended range electric vehicles that combine a battery and a main power source, such as an internal combustion engine, fuel cell system, etc., and electric only vehicles, such as battery electric vehicles. All of these types of electric vehicles employ a high voltage battery that can be different battery types, such as lithium-ion, nickel metal hydride, lead acid, etc. The battery system can include individual battery modules where each battery module may include a certain number of battery cells, such as twelve cells.

Because batteries play an important role in powering electric vehicles and hybrid vehicles, effective battery control and power management is essential to vehicle performance, fuel economy, battery life and passenger comfort. Accurate knowledge of the SOC is critical for proper control of the battery system in an electric vehicle to obtain long battery life and good fuel economy. Because the SOC cannot be directly measured while operating the vehicle, a battery controller needs to predict and estimate the SOC in real-time using other battery parameters such as open circuit voltage and current.

It is well known by those skilled in the art that battery dynamics are generally non-linear and highly dependent on battery operating conditions, which means that an accurate estimation of battery SOC cannot be guaranteed. One approach to estimate the SOC of a battery is to monitor the battery's open circuit voltage. In general, the higher the open circuit voltage the higher the SOC. However, open circuit voltage is inherently difficult to use to accurately estimate the SOC because the battery voltage is influenced by many factors, not just SOC, for example, the temperature, short term charging history, long-term vehicle driving history, age of the battery, etc. For most battery cell chemistries, the voltage level decreases only slightly, if at all, as the battery starts discharging. At some point at a lower SOC the voltage level starts to decrease at a faster rate.

Lithium-ion batteries have proven to be promising for hybrid electric vehicles. Estimating the SOC is significantly more challenging for lithium-ion batteries than the older nickel based technology because lithium-ion based batteries maintain their voltage level for a long time even as the SOC drops. The voltage of a lithium ion battery will not change significantly in a range from about 20% to 80% SOC.

Another way the battery controller can estimate SOC is to calculate the electric charge flowing into and out of the battery by integrating the current over time. One problem with this approach is that the estimated SOC drifts away from the real SOC over time. Therefore, the battery controller needs to reset or readjust the estimated SOC periodically to match the real SOC. One way to reset the estimated SOC is to charge the battery to 100%. However, the vehicle driver may charge the battery when the SOC is down to 30%. The driver may charge the battery for the next trip, but at the start of the next trip, the battery might have been recharged only to 70% SOC. The vehicle could then be driven until the battery drains to 40% SOC and then charged again, still not reaching 100% SOC before the vehicle is off on another trip. Given this type of scenario, resetting the SOC when the charge is at 100% is problematic. Another option is to discharge the battery to 0% SOC, but, as with charging to 100% SOC, this is detrimental to the battery.

What is needed is a way to estimate the SOC of a battery that overcomes the limitations of the current SOC estimation techniques.

SUMMARY OF THE INVENTION

In accordance with the teachings of the present invention, a system and method for monitoring a state-of-charge (SOC) of a battery are disclosed, where the system includes a sensor and a controller. The sensor provides a measurement signal that can track a nominal volume value by either measuring a dimension or pressure of the battery, where the nominal volume is the volume that the electrolyte, anode, cathode and current collectors would occupy if unconstrained. The controller is programmed to use a function to estimate the SOC from the measurement signal. The function can be established after constructing a charging and discharging curve of the battery that graphs the measurement signal compared to the SOC of the battery and finding a characteristic shape.

Additional features of the present invention will become apparent from the following description and appended claims, taken in conjunction with the accompanying drawings.

DETAILED DESCRIPTION OF THE EMBODIMENTS

The following discussion of the embodiments of the invention directed to monitoring the state-of-charge (SOC) of a battery is merely exemplary in nature, and is in no way intended to limit the invention or its applications or uses. For example, the battery controller techniques discussed below have particular application for electric vehicles and lithium-ion batteries. However, as will be appreciated by those skilled in the art, these SOC estimation techniques may have application for other batteries that do not involve electric vehicles, and use other battery chemistries.

Batteries are made of various chemistries and physical structures, where some battery chemistries are known to change in volume based on battery SOC, for example, expanding as the SOC increases. Lithium-ion batteries provide one example of such expansion and are known to build up pressure when they are in a rigid container because of the lithium-ion movement between cathode and anode. The rigid container has to be strong enough to avoid rupture from the pressure exerted by the expanding lithium-ion electrolyte, anode, cathode and current collectors. One way to avoid having to use a strong structure is to allow the volume to increase by building a battery that is contained within a pouch, also known as a soft pack, that allows the expansion to occur so pressure does not build up.

Figure 1:
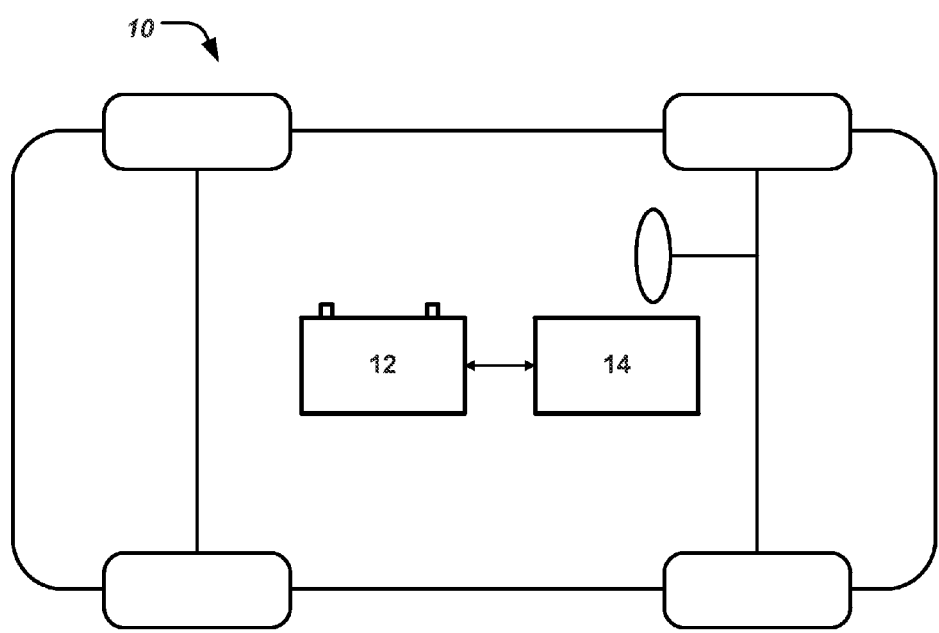
FIG. 1 is an illustration of a vehicle having a battery and a controller.

FIG. 1 is a simple illustration of a vehicle 10 having a battery 12 and a battery controller 14. The controller 14 controls the charging of the battery 12 and the use of the battery 12 to propel the vehicle 10.

Figures 2, 3:
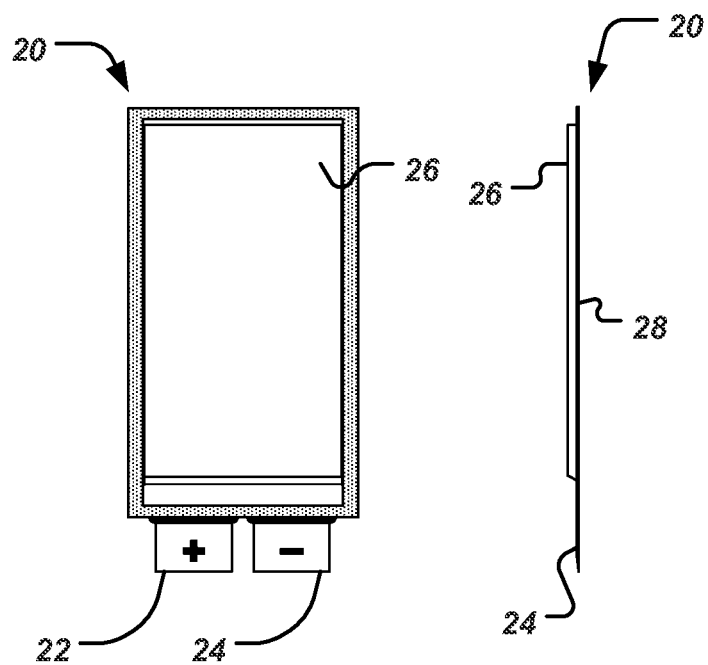
FIG. 2 is a front view of a foil pouch battery cell.
FIG. 3 is a side view of the foil pouch battery cell.

FIG. 2 is a front view and FIG. 3 is a side view of a pouch battery cell 20. The pouch cell 20 has a positive terminal 22 and a negative terminal 24 and a foil covering 26 that provides a gastight seal of the electrolyte, anode, cathode and current collectors of the battery cell 20. The pouch configuration allows the electrolyte, anode and cathode of the battery cell 20 to expand and contract.

Figure 4:
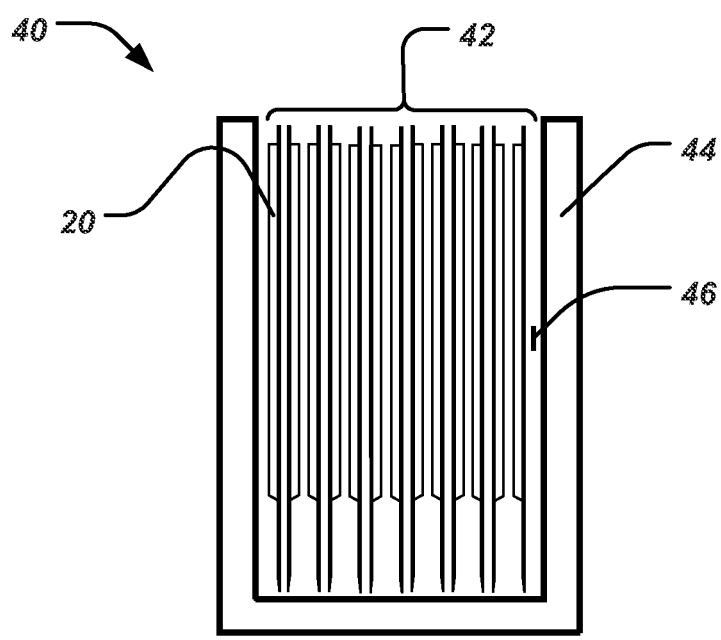
FIG. 4 is a side view of a battery module including a set of pouch battery cells constrained from expanding.

FIG. 4 is a side view of a battery module 40 including a battery cell set 42 having, for example, twelve to sixteen of the pouch battery cells 20, where a foam layer (not shown) may be positioned between the cells 20. The battery cell set 42 is positioned within and constrained by a rigid container 44, where a pressure sensor 46 is provided within the container 44. The pouch battery cells 20 are stacked so that flat surfaces of the cells 20 are positioned next to each other in direct or alternating sequence so that the battery cells 20 can be electrically coupled in parallel or series as appropriate. The thickness of the flat surfaces of the pouch battery cells 20 tends to increase and decrease when charging and discharging the cells 20. Charging the battery module 40 can cause the cell set 42 to expand and contract, where the battery cell set 42 is constrained by the container 44, so that the pressure in the container 44 as measured by the sensor 46 changes.

The pouch battery cell 20 has a preferred pressure that optimizes its operation and is available from the pouch battery cell designer or manufacturer. The container 44 can compress the battery cell set 42 to have a nominal starting pressure based on the preferred pressure.

A set of lithium-ion battery cells was tested in a rigid container and a consistent relationship was found between the change in pressure exerted by a set of lithium-ion pouch battery cells and the SOC of the cells during charging and discharging.

Figure 5:
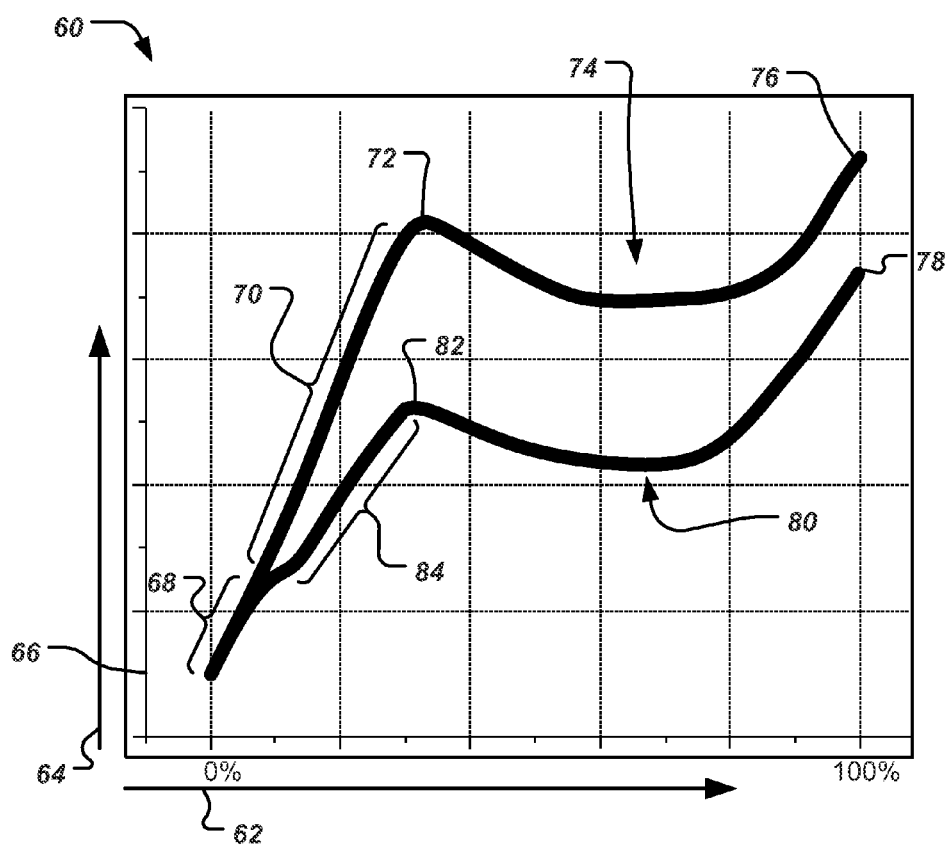
FIG. 5 is a graph showing pressure as a battery is charged and discharged.

FIG. 5 is a graph 60 showing the pressure as the battery module 40 is charged and discharged. The graph 60 displays the SOC along the horizontal axis 62 ranging from 0% SOC to 100% SOC. The pressure measurement is on the vertical axis 64 ranging from a nominal pressure 66 to a maximum pressure 76. The charging curve starts at 0% SOC at the nominal pressure 66, and as the battery module 40 is charged, the SOC increases with a consistent slope in region 68. As the battery module 40 continues charging, at a little less than 10% SOC, the charging curve continues along a slightly steeper slope in region 70 until it reaches a charging local-maximum pressure 72 at a little more than 30% SOC. Next, as the battery module 40 continues to charge the pressure decreases and goes into a trough 74 until about 80% SOC, where the pressure builds again until the pressure reaches point 76 at 100% SOC. As the charged battery module 40 sits and waits for use, the pressure will decrease.

Later, after the fully charged battery module 40 has waited and cooled to a steady state condition, the discharge cycle is started. The pressure starts at point 78. The discharging curve enters a trough 80 where the pressure decreases until the SOC reaches a local minimum at about 60% SOC, at which point the pressure starts to increase until it reaches a local-maximum pressure 82. As the SOC continues to decrease the pressure decreases at a steady rate in region 84 until it reaches the region 68, at less than 10% SOC, where the slope of the discharge continues at the same slope as was seen during earlier charging.

The fact that the battery cell set 42 expands and contracts in a repeatable characteristic pattern can be used to provide an estimated SOC of the battery module 40. Testing showed that a dimension change, particularly the thickness of a pouch cell, which was measured as a change in pressure, can be used to determine the SOC of the battery cell set 42. The characteristic shape may vary in average pressure, but not in shape, and the characteristic feature (local maximum) is always visible in a graph that compares the SOC of the battery module 40 to the pressure while charging or discharging. During operation of the battery module 40, the characteristic feature can be used to determine the SOC of the battery module 40.

There are any number of ways that a battery module can be constructed to measure a change in its nominal volume, where the nominal volume is defined as the volume the electrolyte, anode, cathode and current collectors would occupy if not constrained. A change in the nominal volume can result in a change in a dimension or pressure. The change in size, or dimension, will occur if the size is not constrained. The change in dimension can be monitored with a measurement that includes the size of the cell housing. The change in pressure will occur if the dimension is constrained. A battery can have changes in both dimension and pressure, but one will dominate and that one can be used to estimate the nominal volume, or both the dimension and pressure could be used to estimate the change in nominal volume. There could be a sensor on each battery cell, or one sensor for a group of battery cells, as is shown in the battery module 40. A set of pouch battery cells would produce larger movement then a single pouch battery cell and that could provide increased accuracy in measuring the change in size. Other options are available to measure the nominal volume, for example, a sensor could measure the tension on a band wrapped around a battery cell or a set of cells. Alternatively, a tensioner could keep the band at a constant tension by reeling out and retracting the band as necessary, and then the total length of the band would indicate circumference, which would indicate volume. A band could be useful for other battery designs like cylindrical, prismatic or other. Another option would be to place a pressure sensor inside the metal casing of the battery to measure the pressure. If the temperature of a battery is regulated by a bath of liquid, then the amount of displaced fluid could give an indication of the change in volume of the battery. Many different and alternative configurations and sensors could be used that go well beyond this list to detect the change in nominal volume of the battery to estimate the SOC of the battery.

Although this specification discloses the details for measuring the expansion of a lithium-ion battery, any battery chemistry could be used that results in a change in the nominal volume. Other battery chemistries may have completely different charging and discharging curves. To apply this approach for estimating SOC to other chemistries the steps involved would be to generate the charging and discharging curves by testing and examining the curves for repeatable sections. If there is a repeatable section that provides a characteristic feature, then that characteristic feature could be used as a good location to reset or readjust an electrically estimated SOC of the battery module 40. A characteristic feature is a curve feature that is distinctive enough for an algorithm to determine. Examples of characteristic features would be a local maximum, a local minimum or a point of inflection. The graph 60 shows some examples of characteristic features with the charging local maximum 72 and the discharging local-maximum 82. In one embodiment an algorithm could detect the discharging local-maximum 82 by tracking the pressure when the battery module 40 is discharging and when the pressure switches from increasing to decreasing that would indicate the location of the local-maximum 82.

Figure 6:
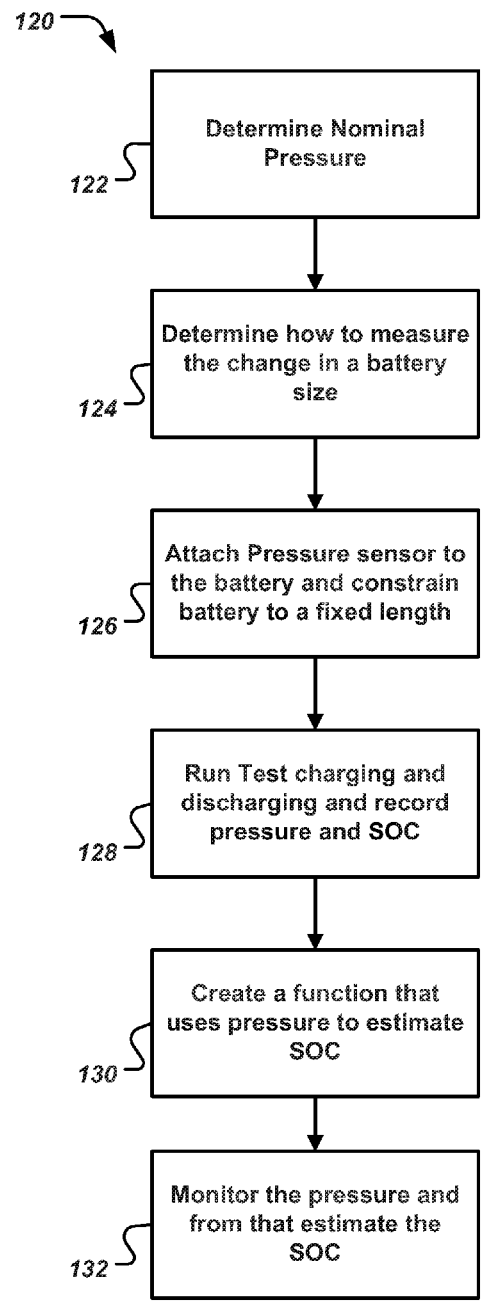
FIG. 6 is an exemplary flowchart showing one possible embodiment for using the change in the nominal volume of the battery to estimate its SOC.

FIG. 6 is a flowchart 120 showing one possible embodiment for using the change in the nominal volume of the battery module 40 to estimate its SOC. The flowchart 120 starts at box 122 where the process determines the nominal pressure based on the battery design. Next, at box 124, the process determines a measurement signal that indicates the change in the nominal value. One option is to measure the pressure that the battery cells 20 exert when constrained in the container 44. At the box 126 the process provides a sensor, for example, the pressure sensor 46 on the battery cell set 42. Next, at box 128, the algorithm runs tests on the battery module 40 to create charging and discharging curves on a graph with the horizontal axis being SOC and the vertical axis being the measurement signal pressure, for example, the graph 60. Next, at box 130, the process creates a function that represents the graph 60, where the measurement signal can be used to estimate the SOC. The function can use any appropriate method, for example, an equation, a lookup table, an algorithm, etc. Finally, at box 132, the battery is in operation and a real-time measurement signal can be used contemporaneously to provide a physically estimated SOC, where a real-time measurement signal is one providing the present state of the battery module 40.

Traditional electrical SOC estimation techniques of a battery may be more accurate on a local basis, but the physically estimated SOC can be more accurate over time because the physically estimated SOC can be more independent of temperatures and other factors. Because the physically estimated SOC can be more accurate and independent it can be used to reset or readjust an electrically estimated SOC, especially because the electrically estimated SOC drifts away from the real SOC over time.

A battery controller can use the electrically estimated SOC of the battery in combination with the physically estimated SOC to provide a more reliable prediction of the SOC. One approach is to use a characteristic feature to reset or readjust the electrical estimated SOC. It would be good to have a characteristic feature on the pressure/SOC graph to reliably locate the position on the charging or discharging curve. The occurrence of the characteristic feature can be used to reset or readjust the electrically estimated SOC. Looking at the graph 60 there is a characteristic feature of the discharge local-maximum 82. When discharging from a high SOC a controller could use the local-maximum 82 to determine the position on the discharging curve and then reset or readjust the electrical estimated SOC, being confident of the location on the curve.

It is preferred to reset or readjust the SOC of the battery when approaching 0% SOC because a 5% estimation error at 90% is not likely important, however, the same 5% makes a big difference when approaching 0% SOC. For example, a 5% over estimation of a 10% SOC would give the impression to the driver that they can make it the whole 10 miles to refuel at home when the reality is the vehicle can only travel 6.6 miles and the driver will end up stranded on the side of the road.

The foregoing discussion discloses and describes merely exemplary embodiments of the present invention. One skilled in the art will readily recognize from such discussion and from the accompanying drawings and claims that various changes, modifications and variations can be made therein without departing from the spirit and scope of the invention as defined in the following claims.

Give all terms used in the claims their broadest reasonable construction and their ordinary meaning as understood by those skilled in the art. Use of the singular articles such as "a", "the", "said", etc. should be read to recite one or more of the indicated elements.

What is claimed is:

1. A system for monitoring a state-of-charge of a battery, said battery including a plurality of pouch-type battery cells arranged in a stack having a thickness, said system comprising:
    a sensor that provides a measurement signal indicative of a nominal thickness of the stack of battery cells, where the nominal thickness is a thickness that the stack of battery cells would have if unconstrained; and
    a controller responsive to the measurement signal and being programmed to use the measurement signal in a function to physically estimate a state-of-charge of the battery, wherein the controller is programmed to reset or readjust an electrically estimated state-of-charge of the battery based on the physically estimated state-of-charge of the battery and based on a characteristic feature of a charging or discharging curve of the battery, where the charging or discharging curve relates the measurement signal to the state-of-charge, and where the characteristic feature is a local maximum, a local minimum or a point of inflection.

2. The system of claim 1 where the thickness of the stack of battery cells is constrained by a housing and the sensor is a pressure sensor situated between an inner wall of the housing and a face of one of the battery cells and providing a pressure measurement signal.

3. The system of claim 1 where the thickness of the stack of battery cells is not constrained and the sensor is a dimension sensor providing a dimension measurement signal corresponding to the thickness.

4. The system of claim 1 where the function includes a history of the measurement signal.

5. The system of claim 1 where the function uses a lookup table.

6. The system of claim 1 where the battery is a lithium-ion battery.

7. A system for monitoring a state-of-charge of a battery, said battery including a plurality of pouch-type battery cells arranged in a stack having a thickness, said system comprising:
    a sensor that provides a dimensional signal indicative of the thickness of the stack of battery cells; and
    a controller responsive to the dimensional signal and being programmed to use a function and the dimensional signal to estimate a state-of-charge of the battery, where the function includes a characteristic feature of a charging or discharging curve of the battery, where the charging or discharging curve relates the dimensional signal to the state-of-charge of the battery, and where the characteristic feature is a local maximum, a local minimum or a point of inflection.

8. The system of claim 7 where the function includes a history of the dimensional signal.

9. A system for monitoring a state-of-charge of a battery, said battery including a plurality of battery cells arranged in a stack within a housing, where the housing constrains a thickness of the stack, said system comprising:

a sensor situated between an inner wall of the housing and a face of one of the battery cells that provides a pressure or force signal indicative of a change in nominal thickness, where the nominal thickness is a thickness that the stack of battery cells would have if unconstrained; and a controller responsive to the pressure or force signal and being programmed to use a function and the pressure or force signal to estimate a state-of-charge of the battery, where the function includes a characteristic feature of a charging or discharging curve of the battery, where the charging or discharging curve relates the pressure or force signal to the state-of-charge of the battery, and where the characteristic feature is a local maximum, local minimum or a point of inflection.

10. The system of claim 9 where the function includes a history of the pressure or force signal.

* * * * *